Aug. 13, 1963 L. S. McMILLIAN, JR., ETAL 3,100,850
BROKEN RING COUNTER CIRCUIT WITH INTERNAL PULSE RESET MEANS
Filed Oct. 25, 1960
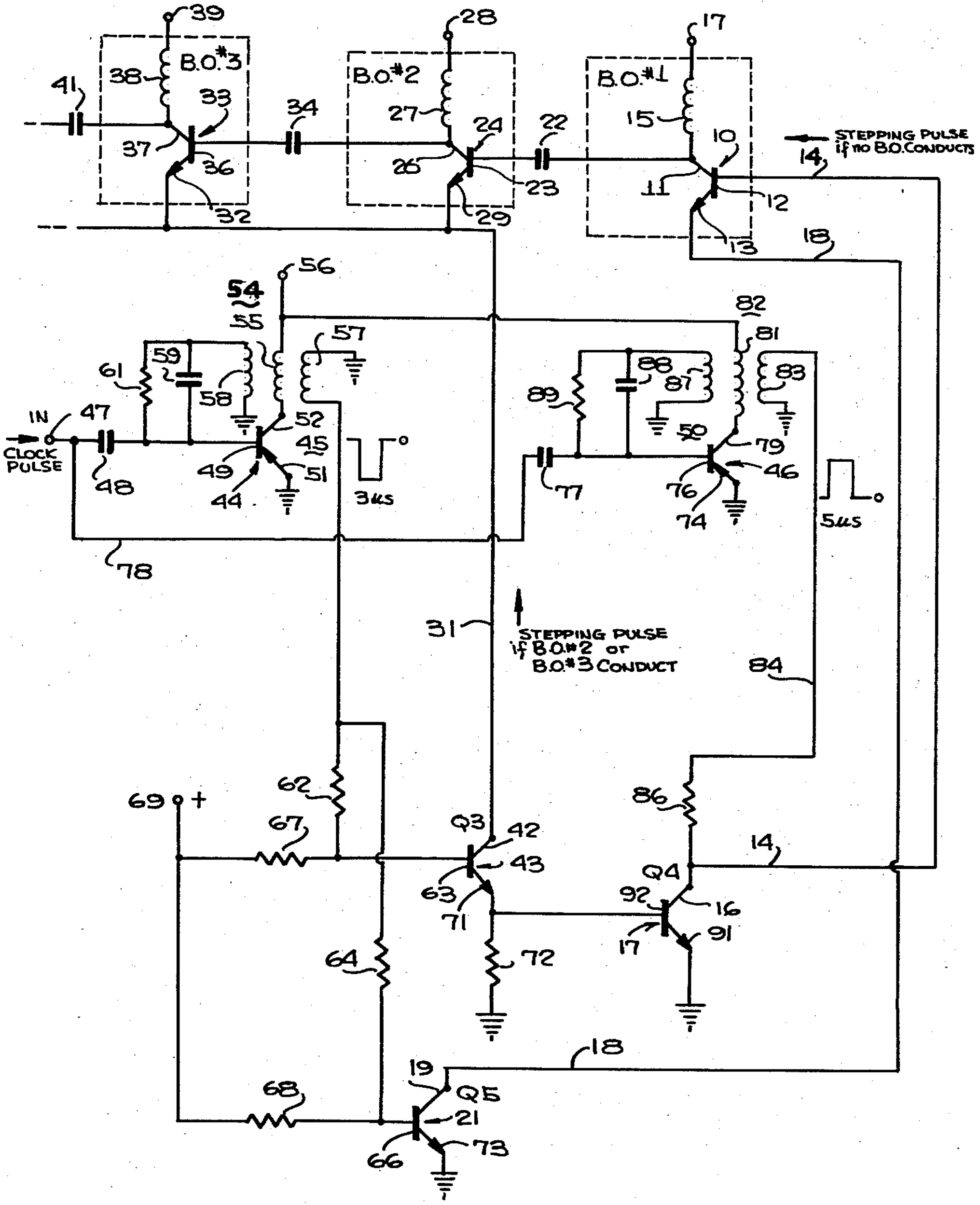
INVENTOR
LONNIE S. McMILLIAN, JR.
WILLIAM T. EDDINS
BY Hurvitz & Rose
ATTORNEYS United States Patent Office 3,100,850

Patented Aug. 13, 1963

3,100,850
BROKEN RING COUNTER CIRCUIT WITH INTERNAL PULSE RESET MEANS

Lonnie S. McMillian, Jr., and William T. Eddins, Melbourne, Fla., assignors to Radiation Incorporated, Melbourne, Fla., a corporation of Florida Filed Oct. 25, 1960, Ser. No. 64,921
14 Claims. (Cl. 307—88.5)

The present invention relates to counter circuits and more particularly to a counter circuit having attributes of both a ring counter and a broken ring counter.

In a conventional type of ring counter, all of the stages are cascaded and arranged such that an incoming pulse shuts off or de-energizes one stage of the counter which, upon becoming de-energized, generates a transfer pulse that produces energization of the next succeeding stage of the counter. This process is continuous and, in a sense, the counter does not have a first or last stage except as determined by the external connection of the output leads from each of the stages of the counter.

The broken ring counter is similar to the ring counter except that there is no end-around carry; that is, no circuit is provided for conducting a transfer pulse generated by the last stage of the counter to the first stage of the counter. In consequence, when the counter has been stepped through a complete counting cycle, an external source must be employed, in addition to the regular clock pulse or stepping pulse, to excite or trigger the first stage of the counter. Conventionally, such a pulse, which is referred to as a frame pulse, is generated by a counter in the clock pulse source which divides the clock pulse rate by a number equal to the number of stages of the counter. The frame pulse is generated once each counter cycle and is applied to an input circuit of the first stage of the counter. The broken ring counter requires more circuitry than the ring counter in that additional circuits must be provided for generating a frame pulse. On the other hand, the number of stages of a broken ring counter is readily variable by merely disabling any predetermined number of stages in the counter and in the corresponding counter in the clock pulse generator so that the proper frame pulse is obtained. If such a variation in the number of stages is attempted in a ring counter, a number of changes in the circuits must be made in order to supply and end-around carry to the first stage.

It is an object of the present invention to provide a counter circuit which appears externally to be a ring counter but from which any predetermined number of stages may be removed from the counter without interfering with its operation.

It is another object of the present invention to provide a broken ring counter circuit that generates its own frame pulse and therefore, operates in the manner of a ring counter but which has the advantage of a broken ring counter in that any number of stages of the counter may be removed without affecting the operation of the circuit.

In accordance with the present invention, the counter comprises a plurality of cascaded blocking oscillators. A circuit is provided for applying a transfer pulse generated by a preceding stage of the counter to the succeeding stage but no end-around carry is provided between the last stage of the counter and the first stage. The counter is further provided with a control circuit which, in response to an input pulse, discontinues energization of a previously energized counter stage, thereby effecting the generation of a transfer pulse by the aforesaid counter stage to render the next succeeding stage of the counter active. A pulse generator is employed to generate a control pulse in response to each incoming pulse applied to the counter circuit. The control pulse is applied to the first stage of the counter to tend to render this stage conductive or energized. However, if any other stage of the counter is rendered conductive as a result of a transfer pulse from the preceding stage, the control pulse applied to the first stage of the counter is rendered ineffective and the first stage of the counter remains de-energized. If, on the other hand, none of the other stages of the counter are rendered conductive as a result of the generation of a transfer pulse, this indicating that the last stage of the counter had previously been conducting, the control pulse applied to the first stage of the counter is effective and renders the first stage of the counter conductive.

The control pulse is inhibited by a circuit connected in series with all of the blocking oscillators of the second through last stages of the counter which performs its inhibiting function regardless of the number of stages to which it is connected. Specifically, the inhibiting circuit, being connected in series with all of the counter stages, senses conduction through any one of them. Since only one counter stage is energized at any time, the number of stages connected in series with the inhibiting circuit is of no consequence and, therefore, any number of stages of the counter may be removed without affecting the operation of the circuit.

It is seen that the uninhibited control pulse that energizes the first stage of the counter conductive serves as a frame pulse for the system. Consequently, external circuits are not required for generating a frame pulse and, further, the internally generated frame pulse may be employed externally of the system for this same purpose.

It is, therefore, another object of the present invention to provide a broken ring counter circuit having control circuits which generate an appropriately timed frame pulse for the apparatus regardless of the number of stages of the counter.

It is yet another object of the present invention to provide a broken ring counter having circuits for generating a frame pulse so that the overall circuit operates as a ring counter except that the number of stages of the counter may readily be altered without affecting the operation of the circuit in any way.

The above and still further objects, features and advantages of the present invention will become apparent upon consideration of the following detailed description of one specific embodiment thereof, especially when taken in conjunction with the accompanying drawing, wherein:

The single FIGURE of the accompanying drawing is a schematic wiring diagram of the counter system of the present invention.

Referring to the single figure of the accompanying drawings, three stages of a broken ring blocking oscillator are illustrated in conjunction with the circuits for controlling the transition of conduction of the counter from stage to stage in response to input pulses. A blocking oscillator stage number 1 includes an NPN transistor 10 having a collector electrode 11, a base electrode 12 and an emitter electrode 13. The collector electrode 11 is connected through a primary winding 12 of a blocking oscillator transformer to a terminal 13 to which a voltage supply is connected. Only the transistor and the primary winding of the blocking oscillator circuit is illustrated since the blocking oscillators employed for the various stages of the broken ring counter are conventional and do not require further illustration. The base electrode 12 of the transistor 10 is connected via a lead 14 to a collector electrode 16 of an NPN transistor 17 in the control circuitry. The emitter electrode 13 of the transistor 10 is connected via a lead 18 to a collector electrode 19 of another NPN transistor 21 in the control circuits. The collector electrode 11 of the transistor 10 is further connected via a coupling and timing capacitor 22 to a base electrode 23 of a transistor 24 which constitutes the active element of a second blocking oscillator #2. The transistor 24 further comprises an emitter electrode 29 and a collector electrode 26 connected via a primary winding 27 of a blocking oscillator transformer to a terminal 28 adapted to be connected to a source of operating potential. The emitter electrode 29 is connected via a lead 31 to the emitter electrodes of the transistors of all of the further stages of the broken ring counter. Since only one further stage of the counter is illustrated, the emitter electrode 29 is connected via the lead 31 to an emitter electrode 32 of a transistor 33 comprising the active element of the blocking oscillator stage #3. The collector electrode 26 of the transistor 24 of the second stage blocking oscillator is connected via a coupling and timing capacitor 34 to a base electrode 36 of the transistor 33. The transistor 33 further includes a collector electrode 37 connected via a primary winding 38 of a blocking oscillator transformer to a voltage supply terminal 39. The collector electrode 37 is also connected via a coupling and timing capacitor 41 to the next stage of the broken ring counter if such exists. Otherwise, the capacitor 41 is eliminated.

The lead 31 is connected to a collector electrode 42 of the transistor 43 connected in the control circuit. In addition to the transistors 17, 21 and 43, the control circuit includes a transistor 44 constituting the active element of a first blocking oscillator 45 in the control circuit and a transistor 46 constituting the active element of a second blocking oscillator 50 of the control circuit. The transistors 44 and 46 are NPN transistors as are the transistors 17, 21 and 43. Input timing pulses are applied to an input terminal 47 and are coupled via a capacitor 48 to a base electrode 49 of the transistor 44. The transistor further comprises a grounded emitter electrode 51 and a collector electrode 52 connected via a primary winding 55 of a blocking oscillator transformer 54 to a voltage supply terminal 56. The transformer 54 has a first secondary winding 57 and a second secondary winding 58. The lower end, as illustrated in the single figure of the accompanying drawings, of the winding 58 is connected via a timing circuit, including a capacitor 59 and a resistor 61 arranged in parallel, to the base electrode 49.

The other secondary winding 57 of the transformer 54 has its upper end grounded and has its lower end connected via a resistor 62 to a base electrode 63 of the transistor 43 and via a further capacitor 64 to a base electrode 66 of the transistor 21. The base electrodes 63 and 66 of the transistors 43 and 21 respectively are connected via resistors 67 and 68 respectively to a terminal 69 adapted to receive positive bias potentials for the bases 63 and 66. The bias potential applied to the terminal 69 is such as to render the transistors 21 and 43 conductive to the point of saturation when collector potentials are applied to these transistors. The transistor 43 further includes an emitter electrode 71 connected to ground via a resistor 72. The transistor 21 includes an emitter electrode 73 connected directly to ground. The transistor 46 of the blocking oscillator 50 includes an emitter electrode 74 connected to ground and a base electrode 76 connected via a coupling capacitor 77 and a lead 78 to the input terminal 47. The transistor 46 further comprises a collector electrode 79 connected via a primary winding 81 of a blocking oscillator transformer 82 to the voltage terminal 56. The transformer 81 comprises a first secondary winding 83 having its lower end grounded and its upper end connected via a lead 84 and a resistor 86 to the collector electrode 16 of the transistor 17. The transformer 82 is provided with a further secondary winding 87 having its lower end as viewed in the accompanying drawing grounded and its upper end connected via a parallel timing circuit, including capacitor 88 and resistor 89, to the base electrode 76.

Completing the description of the control circuit, transistor 17 has an emitter electrode 91 connected to ground and a base electrode 92 connected to the emitter electrode 71 of the transistor 43. The value of the resistor 72 is such that, when the transistor 43 is conducting, the transistor 17 is biased to conduct to the point of saturation. The timing circuits of the blocking oscillators 45 and 50 are such that, when an input pulse is received, a three microsecond negative pulse is developed across the secondary winding 57 of the transformer 54 and a five microsecond positive pulse is developed across the secondary winding 83 of the transformer 82.

In describing the operation of the circuit, it is assumed that initially the blocking oscillator stage #2 of the counter is conducting. Upon the application of a pulse to the terminal 47, the blocking oscillator 45 is rendered conductive and produces a three microsecond negative pulse. Concurrently therewith, the blocking oscillator 50 is rendered conductive and generates a five microsecond positive pulse. The three microsecond pulse developed across the secondary winding 57 of the transformer 54 is applied to the base electrode 63 of the transistor 43 and materially reduces conduction therethrough. The transistor 43 is connected in series with the emitter-collector circuit of the transistors of all stages of the broken ring counter except the first stage. In consequence, due to reduction in conduction of the transistor 43, the conduction of the blocking oscillator #2 is reduced and due to the regenerative action of the oscillator circuit, the transistor 24 is rendered non-conductive. The voltage at the collector electrode of the transistor 24 rises and a positive pulse is coupled through the capacitor 34 to the base electrode 36 of the transistor 33. The time constant of the coupling circuit, including the capacitor 34 and the input impedance of the transistor 33 is such that a time delay of slightly greater than three microseconds is provided. Therefore, the positive pulse generated at the collector electrode 26 of the transistor 24 arrives at the base electrode 36 of the transistor 33 after termination of the negative pulse generated by the blocking oscillator 45. When the three microsecond pulse applied to the base electrode 63 of the transistor 43 terminates, this transistor again becomes conductive to the point of saturation. Therefore, when the positive transfer pulse generated by stage #2 of the counter appears at the base electrode 36 of the transistor 33, the third stage of the counter becomes active.

The five microsecond pulse applied to the lead 84 by the secondary winding 83 of the transformer 82 is employed to render the transistor 10 of the blocking oscillator stage #1 conductive only if none of the other stages of the broken ring counter are rendered conductive. Normally, the transistor 17 is non-conductive since its collector electrode 16 is at ground potential even though a positive bias is applied to its base electrode 92. Upon the generation of the five microsecond positive pulse across the secondary winding 83 of the transformer 82, the collector electrode 16 is positively biased to its operating potential. However, during the first three microseconds of this interval, the transistor 43 is non-conductive and the base 92 of transistor 17 is grounded. The base electrode 76 of the transistor 46 is thus grounded and the transistor 17 is held non-conductive. The transistor 17 presents a high impedance to the circuit, so that during the three microsecond interval of non-conduction of the transistor 43, a positive pulse is applied to the base electrode 12 of the transistor 10 and tends to render it conductive. However, during this same interval, the transistor 21 is rendered non-conductive by the three microsecond pulse applied to its base 66 via resistor 64. The emitter electrode 13 of the transistor 10 is connected to ground through the collector-emitter circuit of the transistor 21 and the transistor 10 cannot be rendered conductive during this three microsecond interval since the emitter circuit of the transistor 10 is effectively open.

During the two microsecond interval when the five microsecond pulse is still active and the three microsecond pulse has been discontinued, the transistor 10 may or may not be rendered conductive depending upon the state of conduction of the remaining stages of the counter. Specifically, at the termination of the three microsecond pulse, the transistor 43 is again biased to conduction. Current flows through the transistor 43, however, only if a transfer pulse renders one of the second through last stages of the broken ring counter conductive. If such is the case, a positive voltage appears across the resistor 72 and the transistor 17 is rendered conductive. When conductive, the transistor 17 shunts the terminal two microseconds of the five microsecond pulse to ground preventing the oscillator of stage #1 from becoming conductive. More particularly, the transistor 17 and resistor 86 form a voltage divider and when the transistor 17 is conductive, the portion of the pulse applied to the transistor 10 is insufficient to trigger the circuit. Therefore, if any one of the second through last stages of the counter is conductive during the terminal two microseconds of the five microsecond pulse, the transistor 10 remains quiescent. If, however, none of the stages of the counter are energized, indicating that the last stage of the counter had previously been conductive and was rendered non-conductive by the three microsecond pulse, no current flows through the transistor 43. In consequence, a voltage is not developed across the resistor 72 and transistor 17 remains non-conductive. The terminal two microseconds of the five microsecond pulse appearing at the collector electrode 16 of the transistor 17 is not attenuated and is applied via the lead 14 to the base electrode 12 of the transistor 10. During this two microsecond interval, the transistor 21 is conductive and therefore, the emitter circuit of the transistor 10 is closed and the transistor 10 is rendered conductive. It is seen therefore, that, while each of the second through final stages of a broken ring counter are rendered conductive in response to discontinuance of conduction of the preceding stage, the first stage of the counter is rendered conductive as result of lack of conduction of any other stage of the counter.

Each of the stages of the counter are blocking oscillators which in conformance with all blocking oscillators are rendered conductive in response to an input pulse only for a predetermined length of time. In order for a counting cycle to be independent of the conduction interval of the blocking oscillator, it is necessary that the active interval of each of the oscillators be considerably greater than the interval between incoming clock pulses applied to the input terminal 47. As long as this condition exists, the conduction of each of the blocking oscillators of the counter is under control of the input pulses only. The fact that each of the stages of the counter is a blocking oscillator does, however, permit a certain degree of flexibility which would not otherwise be obtainable. Specifically, if, for any reason, the source of clock pulses is lost, the counter cycles itself through the last stage after which all stages of the counter are de-energized. More particularly, if the source of clock pulses is lost, the blocking oscillator, which is conductive at the time of this occurrence, becomes non-conductive after a predetermined interval and generates a transfer pulse which renders the next stage of the counter conductive. This sequence continues until the last stage of the counter becomes non-conductive. Since there is no transfer pulse carried from the final stage of the counter to the first stage, all stages of the counter become inactive when the final stage is de-energized. Thereafter, upon the occurrence of the next clock pulse, the first stage of the counter is rendered conductive and cycling starts all over again. This is a desirable feature since clock pulses are normally lost over extended periods of time only if there has been a failure in the external control circuit.

An additional advantage of the present invention is that the counter and its control circuits generate their own frame pulse. Specifically, the terminal two-microseconds of the five microsecond pulse appears on the lead 14 only if the transistor 17 is not conductive during this period. Therefore, the total five microsecond pulse appears on the lead 14 only when the first stage of the blocking oscillator is to be rendered conductive. Obviously, this occurs only once each cycle of the counter and, therefore, the five microsecond pulse on the lead 14 may be employed as a frame pulse.

While I have described and illustrated one specific embodiment of my invention, it will be clear that variations of the details of construction which are specifically illustrated and described may be resorted to without departing from the true spirit and scope of the invention as defined in the appended claims.

What we claim is:

1. A broken ring counter comprising a plurality of counter stages connected in cascade, an input circuit adapted to receive input pulses, means responsive to discontinuance of energization of a preceding stage for energizing the next succeeding stage of the second through last stages of the counter, and means responsive to an input pulse and lack of energization of all of the second through last stages of the counter for energizing the first stage of the counter.

2. A broken ring counter comprising a plurality of counter stages connected in cascade, an input circuit adapted to receive input pulses, means responsive to an input pulse to discontinue energization of an energized counter stage, means responsive to discontinuance of energization of a preceding stage for energizing the next succeeding stage of the second through last stages of the counter, and means responsive to an input pulse and lack of energization of all of the second through last stages of the counter for energizing the first stage of the counter.

3. A broken ring counter comprising a plurality of counter stages connected in cascade, an input circuit adapted to receive input pulses, means responsive to an input pulse and also to a predetermined time interval between input pulses to discontinue energization of an energized counter stage, means responsive to discontinuance of energization of a preceding stage for energizing the next succeeding stage of the second through last stages of the counter, and means responsive to an input pulse and lack of energization of all of the second through last stages of the counter for energizing the first stage of the counter.

4. A broken ring counter comprising a plurality of cascaded counter stages, each of said stages comprising a blocking oscillator having a predetermined period of energization, an input circuit adapted to receive input pulses having a time interval therebetween less than the predetermined period of energization of each blocking oscillator, means responsive to an input pulse to discontinue energization of an energized blocking oscillator counter stage, means responsive to discontinuance of energization of a preceding stage for energizing the next succeeding stage of the second through last stages of the counter, and means responsive to an input pulse and lack of energization of all of the second through last stages of the counter for energizing the first stage of the counter.

5. A broken ring counter comprising a plurality of cascaded counter stages each comprising a blocking oscillator, each of said blocking oscillators having an amplifying element including a common electrode, an input circuit adapted to receive input pulses, means connected in the common electrode circuit of each of said amplifying elements for reducing conduction therethrough in response to an input pulse thereby to discontinue energization of the blocking oscillator, means responsive to discontinuance of energization of a preceding stage for energizing the next succeeding stage of the second through last stages of the counter, and means responsive to an input pulse and lack of energization of all of the second through last stages of the counter for energizing the first stage of the counter.

6. A broken ring counter comprising a plurality of cascaded counter stages each comprising a blocking oscillator, each of said blocking oscillators having an amplifying element including a common electrode, an input circuit adapted to receive input pulses, means connected in the common electrode circuit of each of said amplifying elements for reducing conduction therethrough in response to an input pulse thereby to discontinue energization of the blocking oscillator, means interconnecting said blocking oscillators so as to energize a succeeding stage of the second through last counter stages upon discontinuance of energization of the preceding counter stage, and means responsive to an input pulse and lack of energization of all of the second through last stages of the counter for energizing the first stage of the counter.

7. A broken ring counter comprising a plurality of cascaded counter stages each comprising a blocking oscillator, each of said blocking oscillators having an amplifying element including a common electrode, an input circuit adapted to receive input pulses, means connected in the common electrode circuit of each of said amplifying elements for reducing conduction therethrough in response to an input pulse thereby to discontinue energization of the blocking oscillator, means interconnecting said blocking oscillators so as to energize a succeeding stage of the second through last counter stages upon discontinuance of energization of the preceding counter stage, means responsive to an input pulse for generating a further pulse and means operative for the duration of said further pulse for energizing the first stage of said counter when all of the other stages of the counter are de-energized.

8. A broken ring counter comprising a plurality of counter stages connected in cascade, an input circuit adapted to receive input pulses, means responsive to discontinuance of energization of a preceding stage for energizing the next succeeding stage of the second through last stages of the counter, means responsive to an input pulse for generating a further pulse and means operative for the duration of said further pulse for energizing the first stage of said counter when all of the other stages of the counter are de-energized.

9. A broken ring counter comprising a plurality of cascaded counter stages, means responsive to discontinuance of energization of a preceding stage for energizing the next succeeding stage of the second through last stages of said counter, an input circuit adapted to receive input pulses, first means responsive to an input pulse to generate a first further pulse, second means responsive to an input pulse to generate a second further pulse having at least a predetermined portion occurring later in time than said first further pulse, control means responsive to said first further pulse for discontinuing energization of an energized stage and means responsive to said predetermined portion of said second further pulse and concurrently to lack of energization of any of said second through last stages of said counter for energizing said first stage of said counter.

10. The combination according to claim 9 wherein said control means comprises means for shunting said predetermined portion of said second further pulse to ground during energization of any of said second through last stages of said counter.

11. A broken ring counter responsive to a source of pulses comprising N cascaded two state stages, where N is an integer greater than 1, each of said stages being normally maintained in a first state, means responsive to said source for transferring the second state of the $(K-1)$th stage to the Kth stage in response to a pulse from the source, where K is any integer between 2 and N, inclusive, and means responsive to said source and the states of second through Nth stages for rendering the first stage into the second state only when each of said second through Nth stages are in said first state simultaneously with the occurrence of a pulse from the source.

12. A broken ring counter responsive to a source of pulses comprising means for generating a pair of waveforms in response to each pulse of the source, one of said waveforms having a first predetermined duration, the other of said waveforms having a portion with a time of occurrence immediately subsequent to said one waveform, N cascaded two state stages, where $N \geq 2$, each of said stages being normally maintained in a first state, means for applying said one waveform to the second through Nth stages to transfer the second of such states of the $(K-1)$th stage to the Kth stage, where $2 \leq K \leq N$, and means responsive to the states of the second through Nth stages and said one waveform for applying said portion to the first of said stages to render the first stage into the second state only when he second through N stages are in said first state.

13. The counter of claim 12 wherein the $(K-1)$th stage is immediately returned to the first state in response to said waveform, and means for delaying the transfer between the $(K-1)$th and K stages for a time approximately equal to said predetermined duration.

14. The counter of claim 12 wherein said Kth stage includes means for returning itself to said first state when a fixed time separation between adjacent ones of said pulses occurs.

References Cited in the file of this patent

UNITED STATES PATENTS 2,876,365 Slusser ---------------- Mar. 3, 1959